United States Patent
Avanzino et al.

(10) Patent No.: US 6,268,285 B1
(45) Date of Patent: Jul. 31, 2001

(54) METHOD OF REMOVING PLASMA ETCH DAMAGE TO PRE-SILICIDIZED SURFACES BY WET SILICON ETCH

(75) Inventors: Steven C. Avanzino, Cupertino; Susan H. Chen, Santa Clara, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/225,214

(22) Filed: Jan. 4, 1999

(51) Int. Cl.[7] .................................................. H01L 21/44
(52) U.S. Cl. ..................... 438/655; 438/654; 438/664; 438/682; 438/683; 257/383; 257/384
(58) Field of Search .................................. 438/655, 659, 438/664, 683, 682; 257/383, 384

(56) References Cited

U.S. PATENT DOCUMENTS

| | | | |
|---|---|---|---|
| 4,914,500 | * 4/1990 | Liu et al. | 357/67 |
| 5,258,333 | * 11/1993 | Shappier et al. | 437/235 |
| 5,994,696 | * 11/1999 | Tai et al. | 250/288 |
| 6,010,931 | * 1/2000 | Sun et al. | 438/240 |

* cited by examiner

Primary Examiner—David Nelms
Assistant Examiner—Reneé R. Berry

(57) ABSTRACT

Method and arrangements are provided for removing plasma etch damage to pre-silicidize the surfaces by a wet silicon etch. Following the formation of lightly doped drain (LDD) spacers in conjunction with a refractory metal silicide process, the damage created by the plasma etching to form these sidewall spacers is removed. The silicide that is formed on the pre-silicidized surfaces are substantially free of the etch damage and/or elemental contaminants and exhibits improved quality.

11 Claims, 2 Drawing Sheets

METHOD OF REMOVING PLASMA ETCH DAMAGE TO PRE-SILICIDIZED SURFACES BY WET SILICON ETCH

FIELD OF THE INVENTION

The present invention relates to a method of manufacturing high-density integrated semiconductor devices such as MOS transistors and CMOS devices formed in or on a semiconductor wafer substrate and having low resistance, ultra-shallow junctions forming low junction leakage source and drain regions by utilizing self-aligned, refractory metal silicide ("salicide") processing. The invention has particular utility in manufacturing high-density integration semiconductor devices, including multi-level devices, with design rules of 0.18 micron and below.

BACKGROUND OF THE INVENTION

The escalating requirements for high density and performance associated with ultra-large scale integration semiconductor devices necessitate design rules of 0.18 $\mu$m and below, increased transistor and circuit speeds, high reliability, and increased manufacturing throughput. The reduction of design features, e.g., of source, drain, and gate regions of transistors formed in or on a common semiconductor substrate, challenges the limitations of conventional junction and contact formation technology, including photolithographic, etching, and deposition techniques.

As a result of the ever increasing demand for large-scale and ultra-small dimensioned integrated semiconductor devices, self-aligned techniques have become the preferred technology for forming such devices in view of their simplicity and capability of high-density integration. As device dimensions decrease, both vertically and laterally, many problems arise, especially those caused by an increase in sheet resistance of the contact areas to the source and drain regions and junction leakage as junction layer thickness decreases. To overcome this problem, the use of highly electrically conductive refractory metal silicides has become commonplace in the manufacture of integrated semiconductor devices comprising, e.g., MOS type transistors. Another technique employed in conjunction with refractory metal silicide technology is the use of lightly doped drains ("LDDs"). An LDD consists of a lightly doped source/drain region (i.e., dopant density is on the order of about $9 \times 10^{19}$ at/cm$^3$) formed just at the edge of the gate region, while a more heavily doped drain region (i.e., dopant density is on the order of about $2 \times 10^{20}$ at/cm$^3$), to which ohmic contact is to be provided, is laterally displaced away from the gate by provision of a sidewall spacer on the gate electrode.

Salicide processing involves deposition of a metal that forms an intermetallic compound with silicon, but does not react with silicon oxides or silicon nitrides under normal processing conditions. Refractory metals commonly employed in salicide processing include titanium, nickel, and cobalt, each of which form very low resistivity phases with silicon, e.g., TiSi$_2$, NiSi$_2$, and CoSi$_2$. In practice, the refractory metal is deposited in a uniform thickness over all exposed upper surface features of the silicon wafer, preferably by means of physical vapor deposition (PVD) from an ultra-pure sputtering target and an ultra-high vacuum, multi-chamber DC magnetron sputtering system. In MOS transistor formation, deposition is generally performed both after gate etch and after source/drain junction formation. After deposition, the refractory metal blankets the polysilicon gate electrode, the silicon oxide or nitride spacers, the silicon oxide isolation regions, and the exposed portions of the source and drain regions. As a result of a rapid thermal annealing (RTA) process performed in an inert atmosphere, the refractory metal reacts with underlying silicon to form electrically conductive silicide layer portions on the top surface of the gate electrode and on the exposed portions of the source and drain regions. Unreacted portions of the refractory metal layer, e.g., on the silicon oxide or silicon nitride sidewall spacers and the silicon oxide isolation regions, are then removed, e.g., by use of a wet etch process which is selective to the metal silicide portions. In some instances, e.g., with cobalt, a first RTA step may be performed at a relatively low temperature from about 400° C. to about 550° C. for from about 20 sec to about 120 sec in order to form first-phase CoSi which is then subjected to a second RTA step performed at a relatively high temperature from about 700° C. to about 850° C. for from about 20 sec to about 60 sec to convert the CoSi to second-phase, lower resistivity CoSi$_2$. The second RTA step is performed after selective etch of the non-reacted cobalt. While titanium (Ti) is presently the most prevalent metal utilized in the IC industry for salicide processing, it has a drawback in that titanium silicide (TiSi$_2$) sheet resistance rises dramatically due to narrow-line effects. As a consequence, the use of cobalt silicide (CoSi$_2$) has increased as a result of its replacement of titanium silicide in salicide processing. Second-phase cobalt silicide (CoSi2) advantageously does not display narrow-line effects because it forms by a diffusion reaction mechanism rather than by the nucleation-and-growth mechanism observed with titanium silicide. See, for example, European Patent 0651076.

The formation of the sidewall spacers in accordance with conventional refractory metal silicide technology may adversely affect the quality of the silicide that is subsequently formed in later processing steps. The damage occurs to the silicon and polysilicon surfaces during the plasma etching of the spacer material layer, typically a low temperature oxide, to remove the undesired spacer material that has been conformally deposited over the wafer.

Another problem arising from the etching process is the introduction of contaminants to the previously pure silicon and polysilicon surfaces. Like surface damage, the contaminants negatively impact the quality of subsequently formed silicide.

The surface damage and/or the contaminants created in the silicon and polysilicon surfaces by the plasma etching of the spacer material layer will adversely affect the quality of the silicide, since the silicide will be formed in part from the damaged silicon and polysilicon. The lower quality of the silicide is manifested by a decrease in the structural integrity of the silicide and a higher electrical resistance. This has the unfortunate consequence of lowering the overall speed of the semiconductor chip, or in extreme circumstances, threatening the operation of the chip.

There is a need for a method of forming silicide following the formation of sidewall spacers by plasma etching, in a manner that improves the quality of the silicide that is formed.

SUMMARY OF THE INVENTION

This and other needs are met by the present invention which provides a method of forming silicide on a semiconductor device. The semiconductor device is formed with silicon surface regions and a gate with polysilcon surface regions. Sidewalls spacers are formed on the gate. Surface damage and/or contaminants in the silicon surface regions and the polysilcon surface regions that were introduced during the forming of the sidewall spacers is removed. Silicide is then formed on the silicon surface regions and the polysilicon surface regions.

The removal of surface damage and/or contaminants to the silicon and polysilicon surface regions prior to the silicidation process produces a silicide that is not adversely affected by the damage and/or elemental contaminants. The higher quality silicide is achieved with a relatively low cost approach, by simply removing the damage and/or elemental contaminants introduced in the etching of the sidewall spacers.

The earlier stated needs are also met by another embodiment of the present invention which provides an arrangement comprising a semiconductor device having a polysilicon gate and silicon active regions. Sidewall spacers are provided adjacent the polysilicon gate. The polysilicon gate and the silicon active regions are substantially free of contaminants and plasma etch damage.

The arrangement of the present invention is advantageous in that the polysilcon gate and silicon active regions are substantially free of contaminants and plasma edge damage so that the arrangement is prepared for the silicidation process with contaminant-free and damage-free areas. When the silicide is formed on the damage-free areas, the quality of the silicide is greatly improved.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses and solves the problems created in the formation of sidewall spacers when lightly doped drains (LDDs) are used with refractory metal silicide technology. The damage caused and/or elemental contaminants created during the etching of the spacer material layer to form the sidewall spacers is removed prior to the deposition of the refractory metal layer. The removal of the plasma etch damage (and/or contaminants) therefore pre-silicidizes these surfaces. When the refractory metal layer is deposited over the wafer, a high quality silicide may be formed on the pre-silicidized surfaces since they no longer contain the damaged silicon or elemental contaminants created by the plasma etching which formed the sidewall spacers. The higher quality silicide lowers the resistance and leads to improvements in circuit speed and power consumption.

Figure 1:
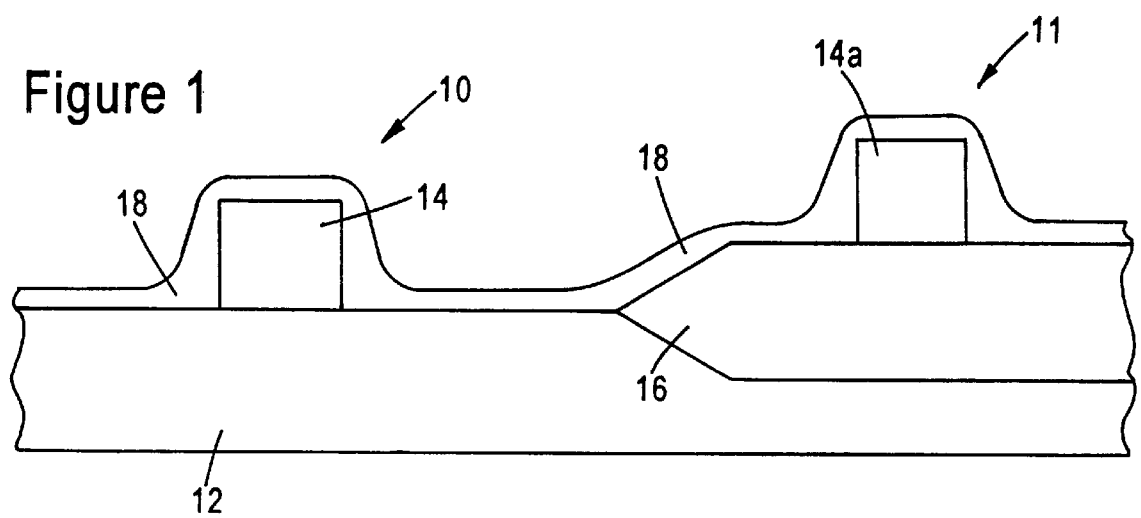
FIG. 1 is a cross-section of a portion of a semiconductor wafer constructed in accordance with an embodiment of the present invention during one stage of the manufacturing process in which a spacer material has been formed in the layer over the wafer.

FIG. 1 depicts a cross-section of a portion of a semiconductor wafer during one stage of the manufacturing process in accordance with the embodiment of the present invention. A transistor device 10 and an adjacent polysilicon line 11 are provided on a substrate 12. One polysilicon gate 14 is provided on the silicon substrate 12. Another polysilicon line 14a is provided on a field oxide region 16. A spacer layer 18 is conformally deposited over the transistor devices 10 and poly line 1. The spacer material may be a low temperature oxide (LTO), PECVD oxide, for example, or a nitride. The formation of the field oxide region 16, the polysilicon features 14 and 14a and the deposition of the spacer layer 18 are performed with conventional methodologies.

Figure 2:
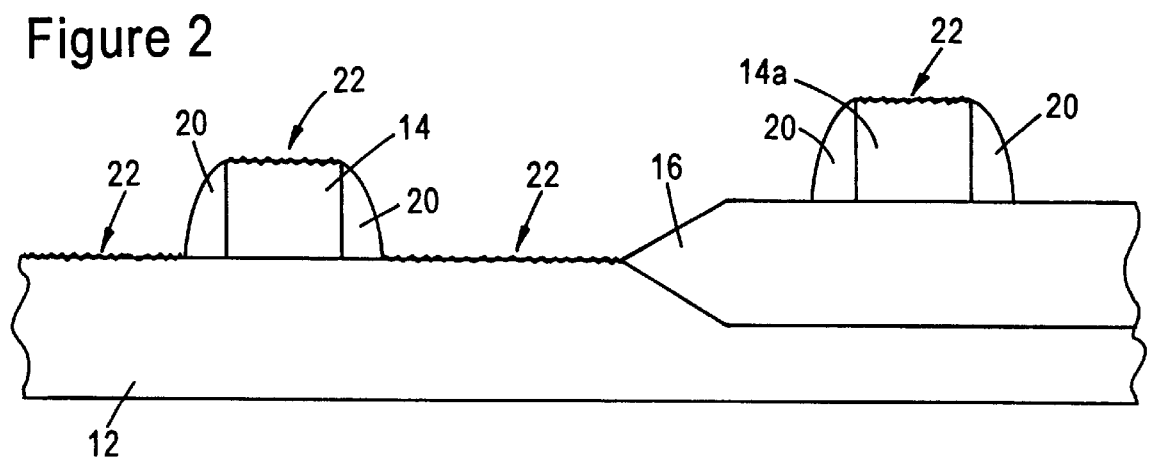
FIG. 2 depicts the portion of FIG. 1 following the etching of the spacer layer to form sidewall spacers on the gates in accordance with an embodiment of the present invention.

The spacer layer 18 is now etched to form sidewall spacers that will be employed in a lightly doped drain, (LDD) process to form the source/drain regions. The spacer material, such as low temperature oxide, is removed following an isotropic etching of the spacer layer 18. The etching leaves sidewalls 20 formed on the features 14 and 14a. Typically, however, the plasma etching process introduce damage to the silicon surfaces and polysilicon surfaces of the semiconductor wafer. The plasma etching process also creates elemental contaminants in the silicon and polysilicon surfaces. The areas that are plasma damaged or contain elemental contaminants are indicated in FIG. 2 by reference number 22.

Figure 3:
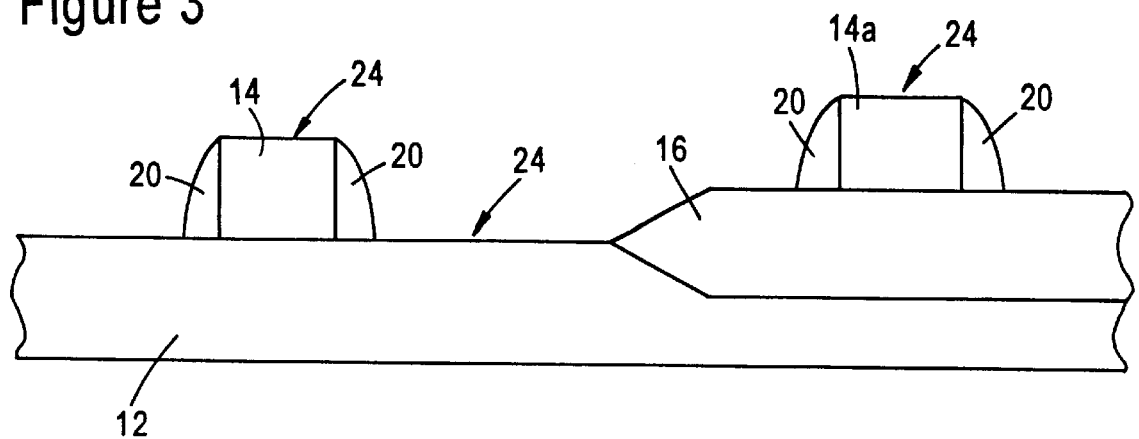
FIG. 3 shows the portion of FIG. 2 after the damaged surfaces and elemental contaminants are removed in accordance with the embodiments of the present invention.

The formation of a silicide over the damaged silicon and polysilicon areas would produce a low-quality silicide. This increases the resistance of the silicide and adversely affects the performance of the device. In order to overcome this problem, the present invention removes the silicon and polysilicon surfaces that have been damaged or in which elemental contaminants have been introduced by the plasma etching process. As seen in FIG. 3, a wet silicon etching has been performed to move the damaged silicon and polysilicon surface areas. In this way, pre-silicidized areas 24 are created that are substantially free of plasma etching damage and elemental contaminants. Several different etch chemistries can be used to remove the damaged silicon and polysilicon surface areas. Generally, the wet etch chemistries that are suitable are characterized by slow silicon etch rates, but have faster etch rates towards plasma damaged silicon surfaces. For example, solutions of strong bases may be used over a range of temperatures, the temperature controlled to regulate the etch rate. Some examples of strong bases are potassium hydroxide, choline hydroxide or tertramethylammonium hydroxide. However, those of skill in the art would recognize that other types of etch chemistries may be used without departing from the spirit or scope of the present invention.

When using one of the strong bases to etch the plasma damaged silicon surfaces 22, the temperature may be controlled initially to a temperature of between about 20° and about 50° C. In order to ensure that the silicon surfaces and polysilicon surfaces are substantially free of plasma damage and/or elemental contaminants, silicon and polysilicon removal amounts of between about 50 and 100 Å may typically be required. The etching may be performed with conventional spray-acid tools or wet bench baths.

Figure 4:
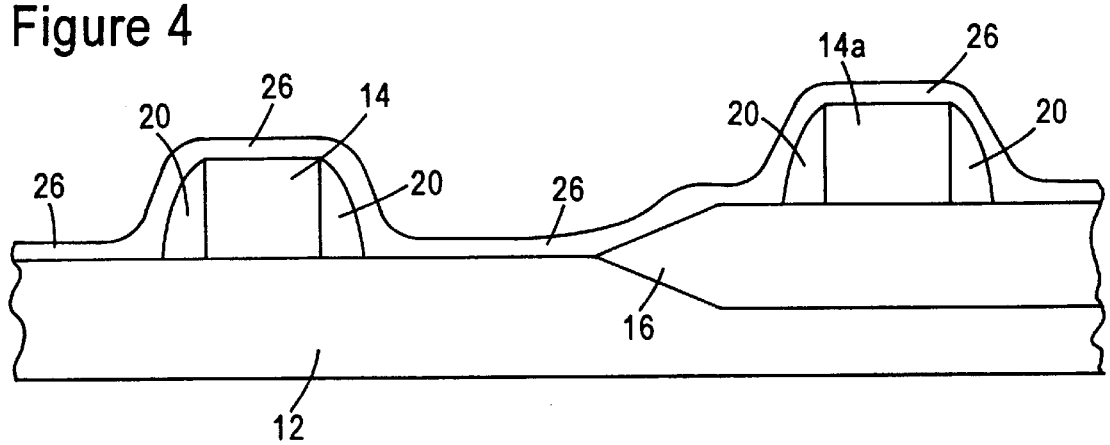
FIG. 4 is a depiction of the portion of FIG. 3 after the deposition of a refractory metal upon the pre-silicidized surfaces in accordance with an embodiment of the present invention.

With the silicon and polysilicon surfaces 24 properly pre-silicidized, doping of the source/drain regions may be performed. This step is not depicted in FIG. 4 to prevent obscuring of the present invention. Following the pre-silicidization of the silicon and polysilicon surfaces 24, a refractory metal layer 26 is conformally deposited (by PVD or CVD, for example) over the arrangement. The refractory metal may be cobalt, for example. Other examples of suitable metals include titanium, nickel, tungsten etc. The resulting structure is depicted in FIG. 4.

Figure 5:
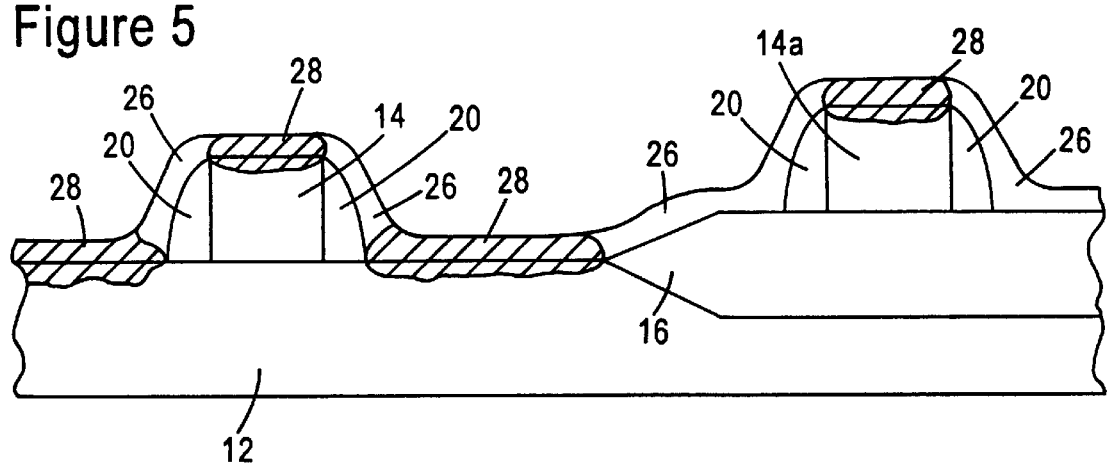
FIG. 5 is a depiction of the portion of FIG. 4 following a rapid thermal annealing to create silicide regions in accordance with an embodiment of the present invention.

Following the deposition of the refractory metal layer 26, one or more annealing steps (such as rapid thermal annealing) are conducted to create silicide regions 28 where the metal and the silicon or polysilicon contact each one another. The silicide regions 28 that are created, such as cobalt silicide ($CoSi_2$) do not suffer from low quality since the silicon that was used as a component in the silicide regions 28 were substantially free of plasma damage or elemental contaminants. The resulting structure is depicted in FIG. 5.

Figure 6:
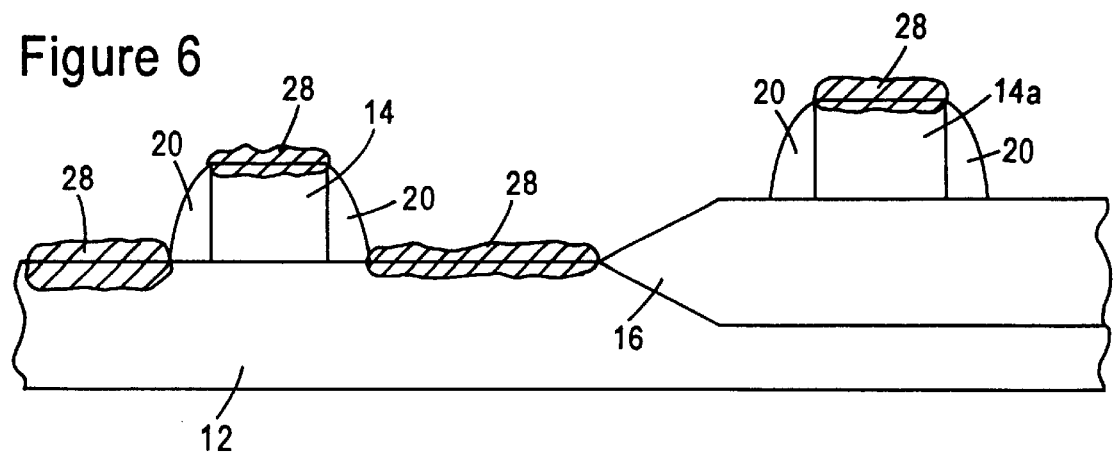
FIG. 6 is a depiction of FIG. 5 after unreacted metal in the metal layer has been removed.

As depicted in FIG. 6, the unreacted metal in the metal layer 26 is removed in a conventional manner to leave the silicide regions 28. The semiconductor wafer is then ready for further processing in accordance with conventional manufacturing methods.

Although the present invention has been described with certain specific examples, such as the types of wet etch chemistries that may be used, the invention is not limited to the specific examples. Other analogous substances may be used to provide the desired etching. For example, non-aqueous silicon etchants may be used for this purpose as well.

Although the present invention has been, described and illustrated in detail, it is to be clearly understood that the same is by way of illustration and example only and is not to be taken by way of limitation, the spirit and scope of the present invention being limited only by the terms of the appended claims.

What is claimed is:

1. A method of forming silicide on a semiconductor device, comprising the steps of:
    forming a semiconductor device with silicon surface regions and a gate with polysilicon surface regions;
    depositing a layer of spacer material over the semiconductor device including the silicon surface regions and polysilicon surface regions;
    performing a first type etching of the spacer layer to form sidewall spacers on sidewalls of the gate, the first type etching process damaging the silicon surface regions and polysilicon surface regions as well as introducing contaminants into both regions;
    performing a second type etching, different from the first type etething, to remove the damaged silicon surface regions and polysilicon surface regions as well as the contaminants introduced into both regions;
    and forming silicide on the silicon surface regions and the polysilicon surface regions.

2. the method of claim 1, wherein the second type etching removes between 50 and 100 Å of each of silicon in the silicon surface regions and polysilicon in the polysilicon surface regions.

3. The method of claim 1, wherein the first type etching comprises anisotropic etching of the spacer layer.

4. The method of claim 3, wherein the anisotropic etching includes plasma etching.

5. The method of claim 1, wherein the second type etching includes wet etching the silicon surface regions and the polysilicon surface regions.

6. The method of claim 5, wherein the wet etching includes exposing the silicon surface regions and the polysilicon surface regions to a wet etch chemistry that etches silicon and polysilicon relatively slowly as compared to plasma damaged silicon and polysilicon surface regions which are etched relatively fast.

7. The method of claim 6, wherein the wet etch chemistry includes a basic solution.

8. The method of claim 7, wherein the basic solution is selected from one of KOH, choline hydroxide, and tetramethylammonium hydroxide.

9. The method of claim 8, further comprising controlling temperature of the semiconductor device during the wet etching to regulate the etch rate of the silicon surface regions and the polysilicon surface regions.

10. The method of claim 9, wherein the temperature is controlle to between about 20° C. and about 50° C. during the wet etching.

11. The method of claim 1, wherein the second type etching includes etching the silicon surface regions and the polysilicon surface regions of the gate with a non-aqueous silicon etchant.

* * * * *